US012719430B2

(12) United States Patent
Iwamoto

(10) Patent No.: US 12,719,430 B2
(45) Date of Patent: Aug. 25, 2026

(54) INTEGRATED CIRCUIT AND SEMICONDUCTOR DEVICE

(71) Applicant: FUJI ELECTRIC CO., LTD., Kawasaki (JP)

(72) Inventor: Motomitsu Iwamoto, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 440 days.

(21) Appl. No.: 18/453,865

(22) Filed: Aug. 22, 2023

(65) Prior Publication Data

US 2024/0097632 A1 Mar. 21, 2024

(30) Foreign Application Priority Data

Sep. 20, 2022 (JP) ................................ 2022-149116

(51) Int. Cl.
*H03F 3/45* (2006.01)
*H03F 1/30* (2006.01)

(52) U.S. Cl.
CPC ......... *H03F 3/45475* (2013.01); *H03F 1/301* (2013.01); *H03F 2200/261* (2013.01); *H03F 2203/45212* (2013.01)

(58) Field of Classification Search
CPC ................ H03F 3/45475; H03F 1/301; H03F 2200/261; H03F 2203/45212
USPC .......................................................... 330/258
See application file for complete search history.

(56) References Cited

U.S. PATENT DOCUMENTS 5,241,850 A * 9/1993 Kawate .................. G01P 21/00 73/514.16
5,257,210 A * 10/1993 Schneider ............... G01D 3/02 702/109
6,312,061 B1 * 11/2001 Schliebe ............. G01D 18/006 73/756

(Continued)

FOREIGN PATENT DOCUMENTS

JP 2000-214029 A 8/2000
JP 2002-214024 A 7/2002

OTHER PUBLICATIONS

Bryan Lizon, Joseph Wu, Application Note: A Basic Guide to Bridge Measurements, Texas Instruments, SBAA532A—Feb. 2022. (Year: 2022).*

*Primary Examiner* — Hafizur Rahman
(74) *Attorney, Agent, or Firm* — Rabin & Berdo, P.C.

(57) ABSTRACT

An integrated circuit includes: an amplifier circuit outputting a first voltage and a second voltage respectively in a first case and a second case, in which two input voltages of opposite polarities are applied to a pair of input terminals of a bridge circuit, the first and second voltages being based on a reference voltage and first and second amplified voltages, obtained by amplifying, by a predetermined gain, first and second output voltages outputted from a pair of output terminals of the bridge circuit; and a reference voltage output circuit setting the reference voltage to a first level and a second level respectively in the first and second cases. The first and second levels respectively correspond to a sum of, and a difference between, a predetermined voltage and another amplified voltage obtained by amplifying, by the predetermined gain, an offset voltage generated at the output terminals of the bridge circuit.

6 Claims, 6 Drawing Sheets

(56) References Cited

U.S. PATENT DOCUMENTS

2015/0236648 A1* 8/2015 Ahmad ............... H03F 3/45977
330/84
2016/0123768 A1* 5/2016 Foletto .................. G01D 5/147
324/207.21
2016/0341800 A1* 11/2016 Schapendonk ........ G01R 33/09
2021/0041266 A1* 2/2021 Li ........................... G01D 5/16
2021/0120881 A1* 4/2021 Marubashi ........... H05B 3/0019
2025/0093288 A1* 3/2025 Pieleanu ................ G01N 27/18

* cited by examiner

Vb
Va
VOLTAGE (V)
5.0
0
Va
Vb
t0
t1
t2
t3
t4
t5
t6

Vc
Vd
Vref
VOLTAGE (V)
2.5
0
Vd
Vc
t0
t1
t2
t3
t4
t5
t6

5.0
Vi
V2
VOLTAGE (V)
2.5
V1
0
t0
t1
t2
t3
t4
t5
t6
TIME (ms)

Vb
Va
VOLTAGE (V)
5.0
0
Va
Vb
t0
t1
t2
t3
t4
t5
t6

Vref
5.0
4.5
Vc
Vd
VOLTAGE (V)
2.5
Vd
Vc
0.5
0
Vref 5.0
3.5
Vi
VOLTAGE (V)
2.5
V2
1.5
V1
0
TIME (ms)

INTEGRATED CIRCUIT AND SEMICONDUCTOR DEVICE

CROSS-REFERENCE TO RELATED APPLICATION

The present application claims priority pursuant to 35 U.S.C. § 119 from Japanese patent application number 2022-149116 filed on Sep. 20, 2022, the entire disclosure of which is hereby incorporated by reference herein.

BACKGROUND

Technical Field

The present disclosure relates to an integrated circuit and a semiconductor device.

Description of the Related Art

For example, a bridge circuit including four resistors coupled in series (bridge coupling) is used as a sensor to detect a physical quantity such as pressure, weight, or acceleration, for example. A minute level of output of the bridge circuit is amplified by a differential amplifier circuit (see, for example, Japanese Patent Application Publication No. 2002-214024). Japanese Patent Application Publication No. 2002-214024 discloses that noise in the differential amplifier circuit can be removed by applying alternating current (AC) voltages to the bridge circuit and calculating a difference between outputs of the bridge circuit.

However, the outputs of the bridge circuit may also contain an error component (offset voltage) in a case where, for example, the resistors included in the bridge circuit vary in resistance value. According to Japanese Patent Application Publication No. 2002-214024, such an error component of the bridge circuit cannot be removed, and thus the detection accuracy of the physical quantity (sensing accuracy) may deteriorate.

SUMMARY

A first aspect of an embodiment of the present disclosure is an integrated circuit coupled to a bridge circuit having a pair of input terminals and a pair of output terminals, the integrated circuit comprising: an amplifier circuit configured to output a first voltage, in a first case in which the pair of input terminals of the bridge circuit have a first input voltage applied thereto, the first voltage being based on a reference voltage and a first amplified voltage that is obtained by amplifying, by a predetermined gain, a first output voltage outputted from the pair of output terminals of the bridge circuit, and output a second voltage, in a second case in which the pair of input terminals of the bridge circuit have a second input voltage of a polarity opposite to that of the first input voltage applied thereto, the second voltage being based on the reference voltage and a second amplified voltage that is obtained by amplifying, by the predetermined gain, a second output voltage outputted from the pair of output terminals of the bridge circuit; and a reference voltage output circuit configured to set a level of the reference voltage to a first level, in the first case, and set the level of the reference voltage to a second level, in the second case, wherein the first level is a level corresponding to a sum of a predetermined voltage and a third amplified voltage that is obtained by amplifying, by the predetermined gain, an offset voltage generated at the pair of output terminals of the bridge circuit, and the second level is a level corresponding to a difference between the predetermined voltage and the third amplified voltage.

A second aspect of an embodiment of the present disclosure is a semiconductor device comprising: a bridge circuit having a pair of input terminals and a pair of output terminals; an amplifier circuit configured to output a first voltage, in a first case in which the pair of input terminals of the bridge circuit have a first input voltage applied thereto, the first voltage being based on a reference voltage and a first amplified voltage that is obtained by amplifying, by a predetermined gain, a first output voltage outputted from the pair of output terminals of the bridge circuit, and output a second voltage, in a second case in which the pair of input terminals of the bridge circuit have a second input voltage of a polarity opposite to that of the first input voltage applied thereto, the second voltage being based on the reference voltage and a second amplified voltage that is obtained by amplifying, by the predetermined gain, a second output voltage outputted from the pair of output terminals of the bridge circuit; and a reference voltage output circuit configured to set a level of the reference voltage to a first level, in the first case, and set the level of the reference voltage to a second level, in the second case, wherein the first level is a level corresponding to a sum of a predetermined voltage and a third amplified voltage that is obtained by amplifying, by the predetermined gain, an offset voltage generated at the pair of output terminals of the bridge circuit, and the second level is a level corresponding to a difference between the predetermined voltage and the third amplified voltage.

DETAILED DESCRIPTION

Figure 1:
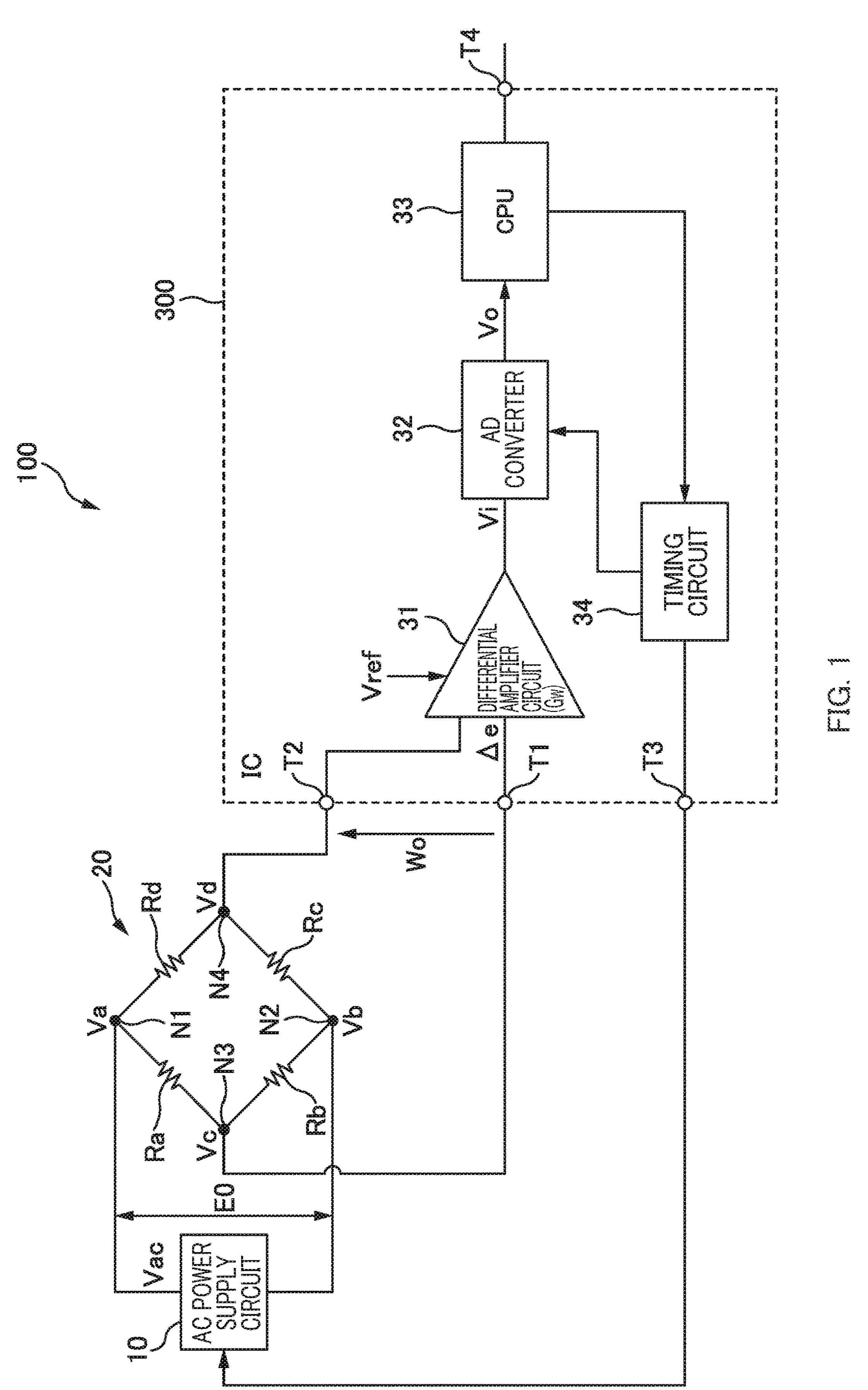
FIG. 1 is a diagram illustrating a configuration of a semiconductor device 100.

At least following matters will become apparent from the descriptions of the present specification and the accompanying drawings.

In the following, the same or equivalent constituent elements illustrated in the drawings will be given the same reference sign, and repetitive description thereof will be omitted for convenience.

In an embodiment of the present disclosure, "coupling" means electrically coupling unless otherwise specified. Thus, "coupling" includes a case where two components are coupled not only through wiring but also through a resistor, for example.

First Embodiment

Comparative Example

A comparative example will be described prior to description of embodiments.

FIG. 1 is a diagram illustrating a configuration of a semiconductor device 100.

The semiconductor device 100 illustrated in FIG. 1 includes an alternating current (AC) power supply circuit 10, a bridge circuit 20, and an integrated circuit (hereinafter referred to as IC) 300. In FIG. 1, a configuration enclosed by a dashed line is the IC 300 integrated on a chip, and the AC power supply circuit 10 and the bridge circuit 20 are external components. However, the configuration is not limited to this, and the AC power supply circuit 10 and the bridge circuit 20 may be internal components in the IC 300 (the same applies to embodiments described below).

The AC power supply circuit 10 generates an AC voltage Vac in response to a signal (timing signal) outputted from a timing circuit 34 (described later). The waveform of the AC voltage Vac is not particularly limited and may be a sine waveform or rectangular waveform, for example, but will be described hereinafter as a rectangular waveform. It is assumed that the amplitude E0 of an output voltage of the AC power supply circuit 10 is 5 V (see FIG. 2A). One of outputs of the AC power supply circuit 10 is applied to a node N1 (described later) of the bridge circuit 20 and the other output is applied to a node N2 (described later) of the bridge circuit 20.

The bridge circuit 20 includes four resistors Ra, Rb, Rc, and Rd, and is configured such that these four resistors Ra to Rd are coupled in series (bridge coupling).

A coupling point between the resistor Ra and the resistor Rd (hereafter referred to as node N1) and a coupling point between the resistor Rb and the resistor Rc (hereafter referred to as node N2) constitute a pair of input terminals, to receive an output (AC voltage) of the AC power supply circuit 10. The voltage at the node N1 will be referred to as Va, and the voltage at the node N2 will be referred to as Vb.

A coupling point between the resistor Ra and the resistor Rb (hereafter referred to as node N3) and a coupling point between the resistor Rc and the resistor Rd (hereafter referred to as node N4) constitute a pair of output terminals. The voltage at the node N3 will be referred to as Vc, and the voltage at the node N4 will be referred to as Vd.

It is assumed that the resistance values (standard values) of the resistors Ra to Rd constituting the bridge circuit 20 are the same. In this case, a difference between the voltage Vc and the voltage Vd at the output terminals (nodes N3 and N4) in a pair in the bridge circuit 20 is ideally zero. However, there may be an error due to the resistance value of each of the resistors as will be described later. When the bridge circuit 20 is used as a sensor, the value or values of one or more resistors change (in other words, the voltages Vc and/or Vd changes) depending on the strength of a property measured. Thus, it is possible to detect a physical quantity such as pressure, based on the changes in the voltages Vc and Vd.

The IC 300 is a circuit to obtain a physical quantity to be detected (e.g., pressure), based on the outputs of the bridge circuit 20. The IC 300 includes a differential amplifier circuit 31, an analog-to-digital converter (AD converter) 32, a CPU 33, the timing circuit 34, and terminals T1 to T4.

The differential amplifier circuit 31 is a circuit to amplify a minute difference between the voltages at the output terminals (nodes N3 and N4) in a pair in the bridge circuit 20. The differential amplifier circuit 31 receives the voltage Vc at the node N3 through the terminal T1 and the voltage Vd at the node N4 through the terminal T2. Then, the differential amplifier circuit 31 outputs a voltage Vi based on a reference voltage Vref and a voltage obtained by amplifying the difference between the voltage Vc and the voltage Vd (output voltage Wo of the bridge circuit 20) by a predetermined amplification factor Gw (here, 10 times) (details will be described later). In the comparative example, the reference voltage Vref is fixed (here, 2.5 V). The differential amplifier circuit 31 operates, based on a power supply voltage Vdd (not illustrated) of 5 V, and the maximum value and the minimum value of the output (voltage Vi) of the differential amplifier circuit 31 are 5 V and 0 V, respectively.

The AD converter 32 converts the voltage Vi outputted from the differential amplifier circuit 31 into a digital signal Vo.

The CPU 33 is a circuit to perform various kinds of arithmetic processing. For example, the CPU 33 calculates a detection result (such as pressure) of sensing by the bridge circuit 20, based on the output (digital signal Vo) of the AD converter 32, to thereby output the calculated detection result to the outside through the terminal T4. The CPU 33 controls the timing circuit 34, to thereby control overall operations of the semiconductor device 100.

The timing circuit 34 generates a timing signal, in response to an instruction from the CPU 33, to thereby output the timing signal to the AD converter 32, and to the AC power supply circuit 10 through the terminal T3.

Figures 2A, 2B, 2C:
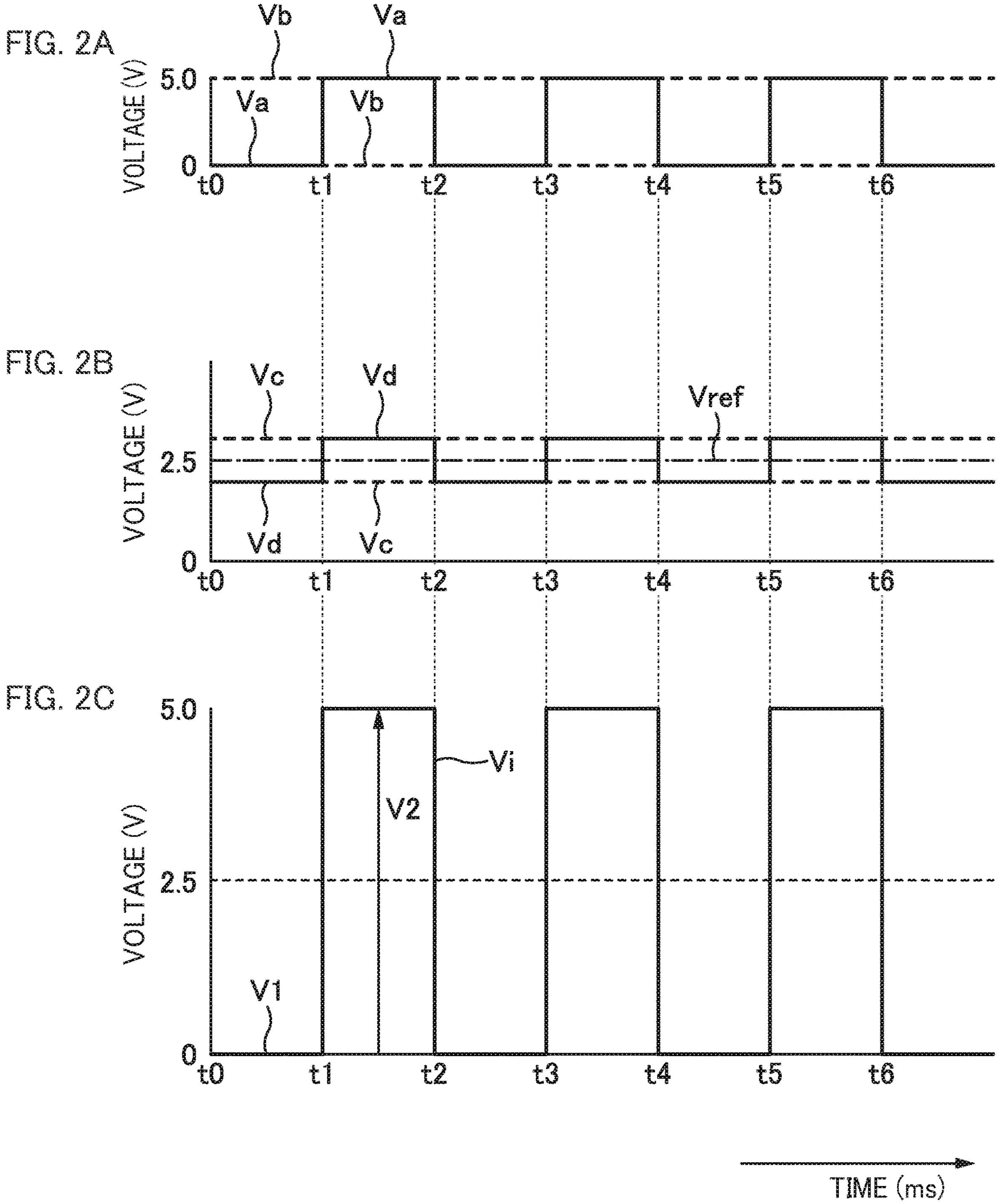
FIGS. 2A to 2C are timing charts in a semiconductor device 100.

FIGS. 2A to 2C are timing charts in the semiconductor device 100. FIG. 2A is a chart presenting of the voltages Va and Vb at the input terminals (nodes N1 and N2) of the bridge circuit 20. In FIG. 2A, the voltage Va is denoted by a solid line and the voltage Vb is denoted by a dashed line. FIG. 2B is a chart presenting inputs to the differential amplifier circuit 31 (in other words, the voltages Vc and Vd at the output terminals (nodes N3 and N4) of the bridge circuit 20) and the reference voltage Vref. In FIG. 2B, the voltage Vc is denoted by a dashed line, the voltage Vd is denoted by a solid line, and the reference voltage Vref is denoted by a dashed-dotted line. FIG. 2C is a chart presenting an output of the differential amplifier circuit 31 (voltage Vi). In FIGS. 2A to 2C, a horizontal axis represents time, and a vertical axis represents voltage. The vertical axes in FIGS. 2A to 2C are different in scale for the sake of convenience. This comparative example explains that an error (offset) component of the differential amplifier circuit 31 can be removed by applying the AC voltage to the bridge circuit 20 (an offset and the like of the bridge circuit 20, which will be described later, are not considered).

The AC power supply circuit 10 applies a rectangular wave of the amplitude E0 between the nodes N1 and N2 of the bridge circuit 20. It is assumed here that the amplitude E0 is 5 V as described above.

From time t0 to t1, the voltage Va at the node N1 is 0 V and the voltage Vb at the node N2 is 5 V in the bridge circuit 20. In this time, as presented in FIG. 2B, the voltage Vc at the node N3 is higher than the reference voltage Vref (2.5 V) and the voltage Vd at the node N4 is lower than the reference voltage Vref. As presented in FIG. 2C, the voltage Vi outputted from the differential amplifier circuit 31 is a voltage V1 that is lower than the reference voltage Vref. A calculation of the voltage Vi (here, voltage V1) and the like will be described later.

At time t1, the polarity of the AC power supply circuit is reversed in response to the timing signal from the timing circuit 34. Specifically, in the bridge circuit 20, the voltage Va at the node N1 reaches 5 V and the voltage Vb at the node N2 reaches 0 V. At this time, as presented in FIG. 2B, the voltage Vc at the node N3 rises above the reference voltage Vref (2.5 V) and the voltage Vd at the node N4 drops below the reference voltage Vref. As presented in FIG. 2C, the voltage Vi outputted from the differential amplifier circuit 31 reaches a voltage V2.

At time t2, the polarity of the AC power supply circuit 10 is reversed in response to the timing signal from the timing circuit 34, and the voltages Va and Vb (and the voltages Vc and Vd) results in the same relationship as that from time t0 to t1. The voltage Vi outputted from the differential amplifier circuit 31 also reaches the voltage V1. Subsequently, the values of the voltages Va and Vb, the voltages Vc and Vd, and the voltage Vi will change in the same manner.

When the differential amplifier circuit 31 has an offset (denoted by Δe), the voltage Vi outputted from the differential amplifier circuit 31 is expressed by Formula (1) as follows:

$$Vi=Vref+Gw(\pm Wo+\Delta e) \qquad (1),$$

where Gw is an amplification factor (gain) of the differential amplifier circuit 31 and Wo is the output voltage of the bridge circuit 20 (difference voltage between the voltage Vc and the voltage Vd).

Figure 3:
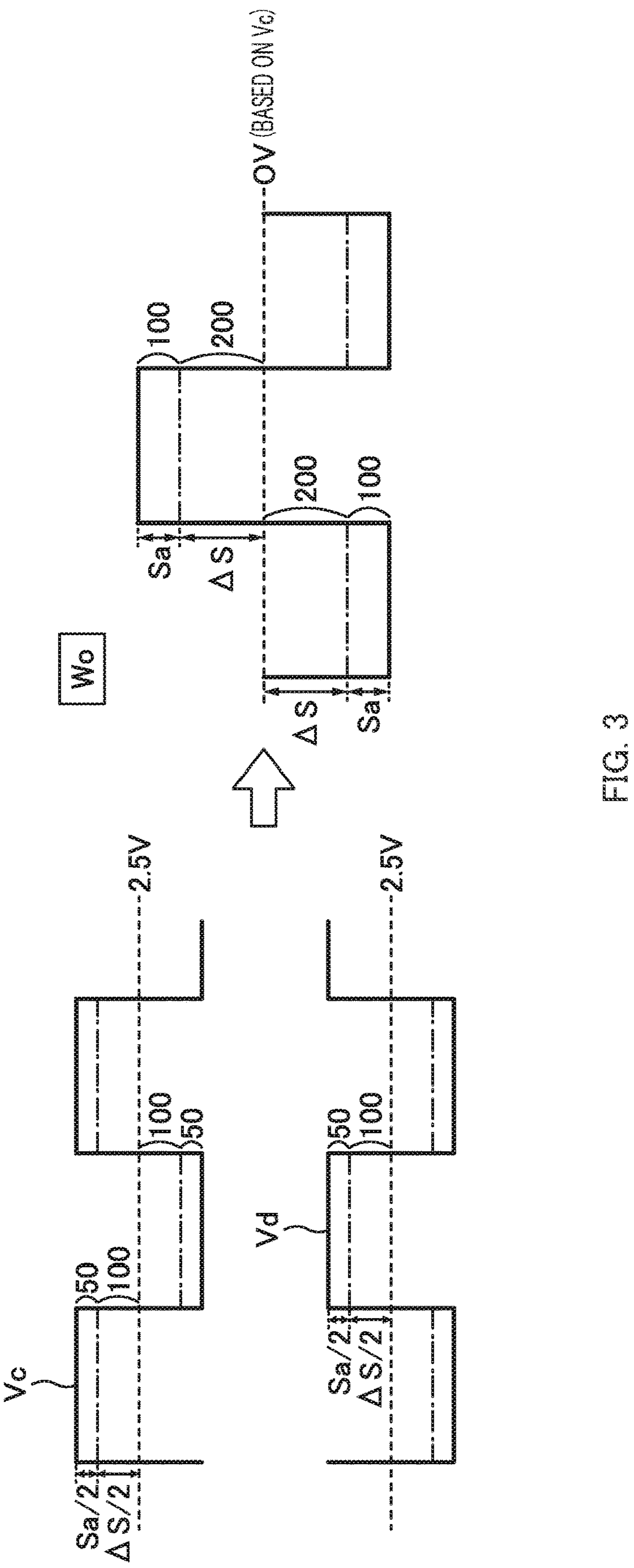
FIG. 3 is an explanatory chart of an output voltage Wo and an offset voltage ΔS of a bridge circuit 20.

Note that the output voltage Wo is based on the potential of the voltage Vc, and ± in Formula (1) means that the sign of Wo is reversed at certain time intervals due to the AC voltage being applied to the bridge circuit 20 (see FIG. 3).

Further, Δe is an offset voltage of an operational amplifier (not illustrated) inside the differential amplifier circuit 31, and is difficult to correct at the CPU 33 and the like in the subsequent stage. However, with the AC voltage being inputted to the bridge circuit 20, it becomes possible to remove Δe. Specifically, assuming that the voltage vi from time t0 to t1 is V1, that is, the output voltage of the bridge circuit 20 from time t0 to t1 is V1 is −Wo, and the voltage vi from time t1 to t2 is V2, that is, the output voltage of the bridge circuit 20 from time t1 to t2 is +Wo, V1 and V2 are expressed by the following Formulas:

$$V1=Vref+Gw\times\Delta e-Gw\times Wo \qquad (2);\text{ and}$$

$$V2=Vref+Gw\times\Delta e+Gw\times Wo \qquad (3).$$

Then, subtracting Formula (2) from Formula (3) gives $$V2-V1=2(Gw\times Wo) \qquad (4).$$

For example, the CPU 33 performs the above calculation, thereby being able to remove the offset voltage Δe of the differential amplifier circuit 31. Although it is assumed here that the error in the differential amplifier circuit 31 is the offset voltage Δe, the error in the differential amplifier circuit 31 also includes flicker noise and the like. These errors (such as noise) can also be removed by the above calculation in the same manner.

The output voltage Wo of the bridge circuit 20 may also contain an error component (hereinafter referred to as offset voltage) due to manufacturing variations and the like of the resistors (R1 to R4) included in the bridge circuit 20.

FIG. 3 is an explanatory chart of the output voltage Wo and an offset voltage ΔS of the bridge circuit 20. In FIG. 3, Sa denotes a signal component of an actual sensor output (hereinafter referred to as detection voltage) contained in the output voltage Wo, and ΔS denotes an offset voltage contained in the output voltage Wo.

The left side of FIG. 3 is a chart illustrating a relationship between the voltages Vc and Vd and the offset voltage included in each of the voltages Vc and Vd, where the voltages Vc and Vd are denoted by solid lines and the offset voltages are denoted by dashed-dotted lines. The voltages Vc and Vd have rectangular waves of polarities opposite to each other (e.g., rectangular waves with an amplitude of 150 mV) and each contain an offset voltage (ΔS/2) of, for example, 100 mV. A difference between the solid line and the dashed-dotted line (e.g., 50 mV) is a signal component (Sa/2) of the sensor.

The right side of FIG. 3 is a chart illustrating the output voltage Wo (a voltage based on a Vc potential) and the offset voltage ΔS of the bridge circuit 20 at the time when the voltages Vc and Vd behave as depicted on the left side, where the output voltage Wo is denoted by a solid line and the offset voltage ΔS is denoted by a dashed-dotted line. As illustrated in FIG. 3, the output voltage Wo of the bridge circuit 20 based on the Vc potential has a rectangular wave with an amplitude of, for example, 300 mV around the Vc potential, and this amplitude includes the detection voltage Sa (100 mV) and the offset voltage ΔS (200 mV). The offset voltage ΔS contained in the output voltage Wo of the bridge circuit 20 cannot be removed with the calculations of the above Formulas (2) to (4).

The amplification factor Gw of the differential amplifier circuit 31 is 10 times. When the amplitude of the output voltage Wo of the bridge circuit 20 is 300 mV as illustrated in FIG. 3, the voltage Vi outputted from the differential amplifier circuit 31 has an amplitude of 300 mV×10=3 V (−0.5 V to 5.5 V) around the reference voltage Vref (2.5 V). However, since the power supply voltage Vdd of the differential amplifier circuit 31 is 5 V as described above, the differential amplifier circuit 31 cannot output a voltage higher than 5 V.

In addition, the differential amplifier circuit 31 cannot output a voltage lower than a ground potential (0 V). For this reason, as illustrated in FIG. 2C, the output of the differential amplifier circuit 31 is clamped at 0 V on the lower side and at 5 V on the higher side. When the output voltage of the differential amplifier circuit 31 is clamped as such, such an issue arises that even if the CPU 33 tries to make correction to remove the offset voltage ΔS of the bridge circuit 20 after AD conversion, the CPU 33 cannot make the correction completely.

To address this, in embodiments according to the present disclosure, with the level of the reference voltage Vref being changed, it is possible to remove the offset voltage contained in the output voltage Wo of the bridge circuit 20 and also prevent the output of the differential amplifier circuit 31 from being saturated, as will be described below.

Embodiments of the Present Disclosure

Figure 4:
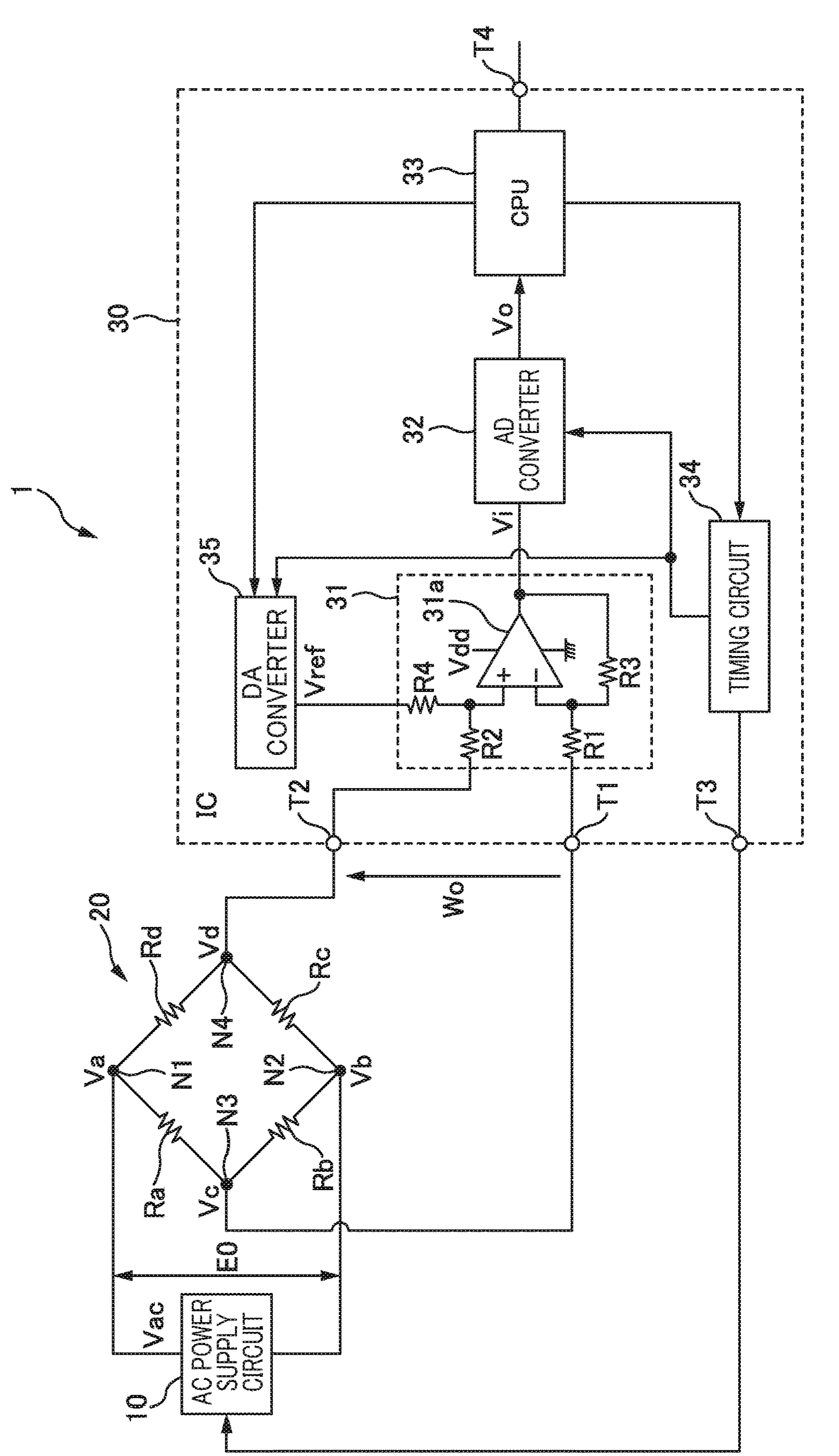
FIG. 4 is a diagram illustrating a configuration of a semiconductor device 1 according to a first embodiment.

FIG. 4 is a diagram illustrating a configuration of a semiconductor device 1 according to a first embodiment. As illustrated in FIG. 4, the semiconductor device 1 includes an AC power supply circuit 10, a bridge circuit 20, and an integrated circuit (IC) 30.

The IC 30 includes a differential amplifier circuit 31, an AD converter 32, a CPU 33, a timing circuit 34, a digital-analog converter (hereinafter, referred to as DA converter) 35, and terminals T1 to T4. Note that the differential amplifier circuit 31 corresponds to an “amplifier circuit”, the CPU 33 corresponds to a “processor circuit”, and the DA converter 35 corresponds to a “reference voltage output circuit”.

The differential amplifier circuit 31 includes an operational amplifier 31*a* and resistors R1 to R4.

The operational amplifier 31*a* has, as input terminals, a negative terminal (inverting input terminal) and a positive terminal (non-inverting input terminal), and outputs, as a difference between the voltages at these input terminals, a voltage Vi based on a reference voltage Vref and an amplification factor Gw (10 times in an embodiment of the present disclosure) determined by the resistors R1 to R4. Note that the amplification factor Gw corresponds to a "predetermined gain".

The resistor R1 is coupled between the node N3 of the bridge circuit 20 and the negative terminal of the operational amplifier 31*a*. The resistor R2 is coupled between the node N4 of the bridge circuit 20 and the positive terminal of the operational amplifier 31*a*. The resistor R3 is a feedback resistor coupled between an output of the operational amplifier 31*a* and the negative terminal of the operational amplifier 31*a*. *The resistor R*4 has one end coupled to the positive terminal of the operational amplifier 31*a*, and the other end coupled to the DA converter 35. Then, the reference voltage Vref is applied to the other end of the resistor R4. Note that the resistors R1, R2, R3, and R4 correspond to a "first resistor", a "second resistor", a "third resistor", and a "fourth resistor", respectively.

In an embodiment of the present disclosure, the resistance values of the resistors R1 and R2 are 10 kΩ, and the resistance values of the resistors R3 and R4 are 100 kΩ. With this configuration, the differential amplifier circuit 31 amplifies a minute level of a difference voltage between the input of the positive terminal (voltage Vd) and the input of the negative terminal (voltage Vc) by a ratio of the resistor R1 (=R2) to the resistor R3 (=R4) (10 times), based on the reference voltage Vref (see Formula 1).

$$Vi = Vref + Gw(\pm Wo + \Delta e) \quad (1)$$

$$= Vref + Gw\{\pm(Sa + \Delta S) + \Delta e\} \quad (1a)$$

The DA converter 35 outputs the reference voltage Vref at a level according to an instruction from the CPU 33. Specifically, two levels (2.5 V±200 mV×10) are set according to a sum of and a difference between a reference voltage (here 2.5 V) and a voltage obtained by multiplying the offset voltage ΔS (here, 200 mV) of the bridge circuit 20 by the amplification factor Gw (here, 10 times) of the differential amplifier circuit 31. The reference voltage Vref is switched between these two levels, in response to a timing signal from the timing circuit 34.

For example, when ΔS is negative, the DA converter 35 outputs a voltage (Vref1) at a level at which Gw×(−ΔS) is canceled out, based on the original reference voltage Vref. Vref1 is obtained by Formula (5) as follows:

$$Vref1 = Vref + \Delta S \times Gw \quad (5)$$

For example, when ΔS is positive, the DA converter 35 outputs a voltage (Vref2) at a level at which Gw×ΔS is canceled out, based on the original reference voltage Vref.

Vref2 is obtained by Formula (6) as follows:

$$Vref2 = Vref - \Delta S \times Gw \quad (6)$$

In embodiments of the present disclosure, the offset voltage ΔS of the bridge circuit 20 is previously measured by calibration and stored in the CPU 33 or the like. Then, the CPU 33 causes the DA converter 35 to generate the reference voltage Vref at the two levels, based on the stored offset voltage ΔS (200 mv), and controls the timing circuit 34 to switch the level of the reference voltage Vref between Vref 1 and Vref2 at a timing at which the polarity of the AC power supply circuit 10 is switched.

Figures 5A, 5B, 5C:
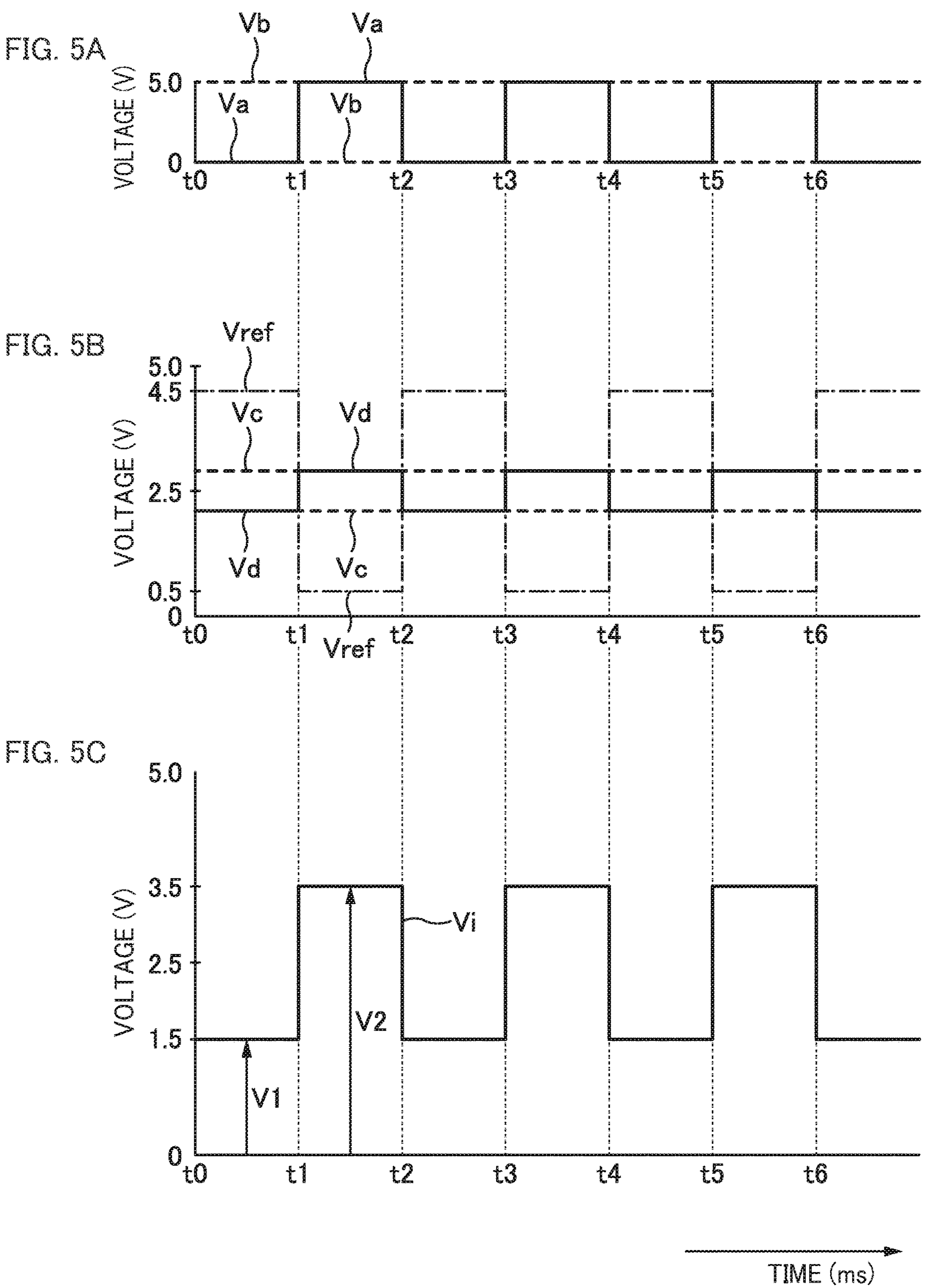
FIGS. 5A to 5C are timing charts in a semiconductor device 1 according to a first embodiment.

FIGS. 5A to 5C are timing charts in the semiconductor device 1 according to the first embodiment. FIG. 5A is a chart presenting the voltages Va and Vb at the input terminals (nodes N1 and N2) of the bridge circuit 20. In FIG. 5A, the voltage Va is denoted by a solid line, and the voltage Vb is denoted by a dashed line. FIG. 5B is a chart presenting inputs to the differential amplifier circuit 31 (in other words, the voltages Vc and Vd at the output terminals (nodes N3 and N4) of the bridge circuit 20) and the reference voltage Vref. In FIG. 5B, the voltage Vc is denoted by a dashed line, the voltage Vd is denoted by a solid line, and the reference voltage Vref is denoted by a dashed-dotted line. FIG. 5C is a chart presenting an output of the differential amplifier circuit 31 (voltage Vi). In FIGS. 5A to 5C, a horizontal axis represents time, and a vertical axis represents voltage. Also in an embodiment of the present disclosure, the amplification factor Gw of the differential amplifier circuit 31 is 10 times.

In an embodiment of the present disclosure, the voltages Va and Vb and the voltages Vc and Vd of the bridge circuit 20 are the same as in the comparative example. However, in an embodiment of the present disclosure, as illustrated in FIG. 5B, the levels of the reference voltage Vref are different from the level thereof in the comparative example (FIG. 2B).

The CPU 33 according to an embodiment of the present disclosure switches the level of the reference voltage Vref outputted from the DA converter 35 at a timing at which the polarity of the AC power supply circuit 10 (in other words, the high and low levels of the voltage Va and the voltage Vb) is switched.

For example, when Va<Vb (time t0 to t1, t2 to t3, t4 to t5, and so on) in FIG. 5A, Vd<Vc as illustrated in FIG. 5B. In addition, when Vd<Vc, ΔS is negative as illustrated in FIG. 3. In this case, the CPU 33 sets the level of the reference voltage Vref, which is to be outputted from the DA converter 35, to Vref1. Specifically, the CPU 33 sets it to 4.5 V (=2.5 V+200 mV×10) obtained by Formula (5) using the offset voltage ΔS (200 mV) and the amplification factor Gw (10 times) of the differential amplifier circuit 31.

Note that the reference voltage Vref (Vref1) of 4.5 V corresponds to a "first level" and a time period during which this reference voltage Vref is outputted (when Vb>Va holds in the input voltages inputted to the bridge circuit 20) corresponds to a "first case". In addition, an input voltage (−5 V based on Vb) to the pair of input terminals (nodes N1 and N2) of the bridge circuit 20 in this time corresponds to a "first input voltage". Further, 2.5 V used as the reference corresponds to a "predetermined voltage".

In addition, when Va>Vb (time t1 to t2, t3 to t4, t5 to t6, and so on) in FIG. 5A, Vd>Vc as illustrated in FIG. 5B. Further, when Vd>Vc, ΔS is positive as illustrated in FIG. 3. In this case, the CPU 33 sets the level of the reference voltage Vref, which is to be outputted from the DA converter 35, to Vref2. Specifically, the CPU 33 sets it to 0.5 V (=2.5 V-200 mV×10) obtained by Formula (6) using the offset voltage ΔS (200 mV) and the amplification factor Gw (10 times) of the differential amplifier circuit 31.

Note that the reference voltage Vref (Vref2) of 0.5 V corresponds to a "second level" and a time period during which this reference voltage Vref is outputted (when Va>Vb holds in the input voltages inputted to the bridge circuit 20) corresponds to a "second case". Further, an input voltage (5

V based on Vb) to the pair of input terminals (nodes N1 and N2) of the bridge circuit 20 in this time corresponds to a "second input voltage".

From time t0 to t1, the output voltage Wo of the bridge circuit 20 is −300 mV and the reference voltage Vref1 is 4.5 V. Accordingly, assuming that V1 is the voltage Vi outputted from the differential amplifier circuit 31 in this time, V1 is given as follows:

$$V1=-300(mV)\times 10+4.5(V)=1.5(V).$$

Note that the output voltage Wo (−300 mV) of the bridge circuit 20 in this time corresponds to a "first output voltage" and the voltage V1 corresponds to a "first voltage".

From time t1 to t2, the output voltage Wo of the bridge circuit 20 is 300 mV, and the reference voltage Vref2 is 0.5 V. Accordingly, assuming that V2 is the voltage Vi outputted from the differential amplifier circuit 31 in this time, V2 is given as follows:

$$V2=300(mV)\times 10+0.5(V)=3.5(V).$$

Note that the output voltage Wo (300 mV) of the bridge circuit 20 in this time corresponds to a "second output voltage", and the voltage V2 corresponds to a "second voltage". From that point on, the same processing is performed.

Here, when the difference between the above two voltages (V2−V1) is divided by 2, $$(V2-V1)/2=1(V)$$

is given. This value is equal to a value obtained by multiplying the detection voltage Sa (100 mV) of the bridge circuit 20 by the amplification factor Gw (10 times) of the differential amplifier circuit 31. Thus, it is understood that the offset voltage ΔS (200 mV) of the bridge circuit 20 can be removed.

Further, although omitted in the above description, the error (offset voltage Δe) of the differential amplifier circuit 31 can also be removed as in the comparative example, because the difference between V2 and V1 is calculated. Moreover, in an embodiment of the present disclosure, with the level of the reference voltage Vref being changed, both the voltages V1 and V2 are within the operating voltage range (0 to 5 V) of the differential amplifier circuit 31. Thus, it is possible to prevent the output of the differential amplifier circuit 31 from being saturated (from being clamped).

Second Embodiment

Figure 6:
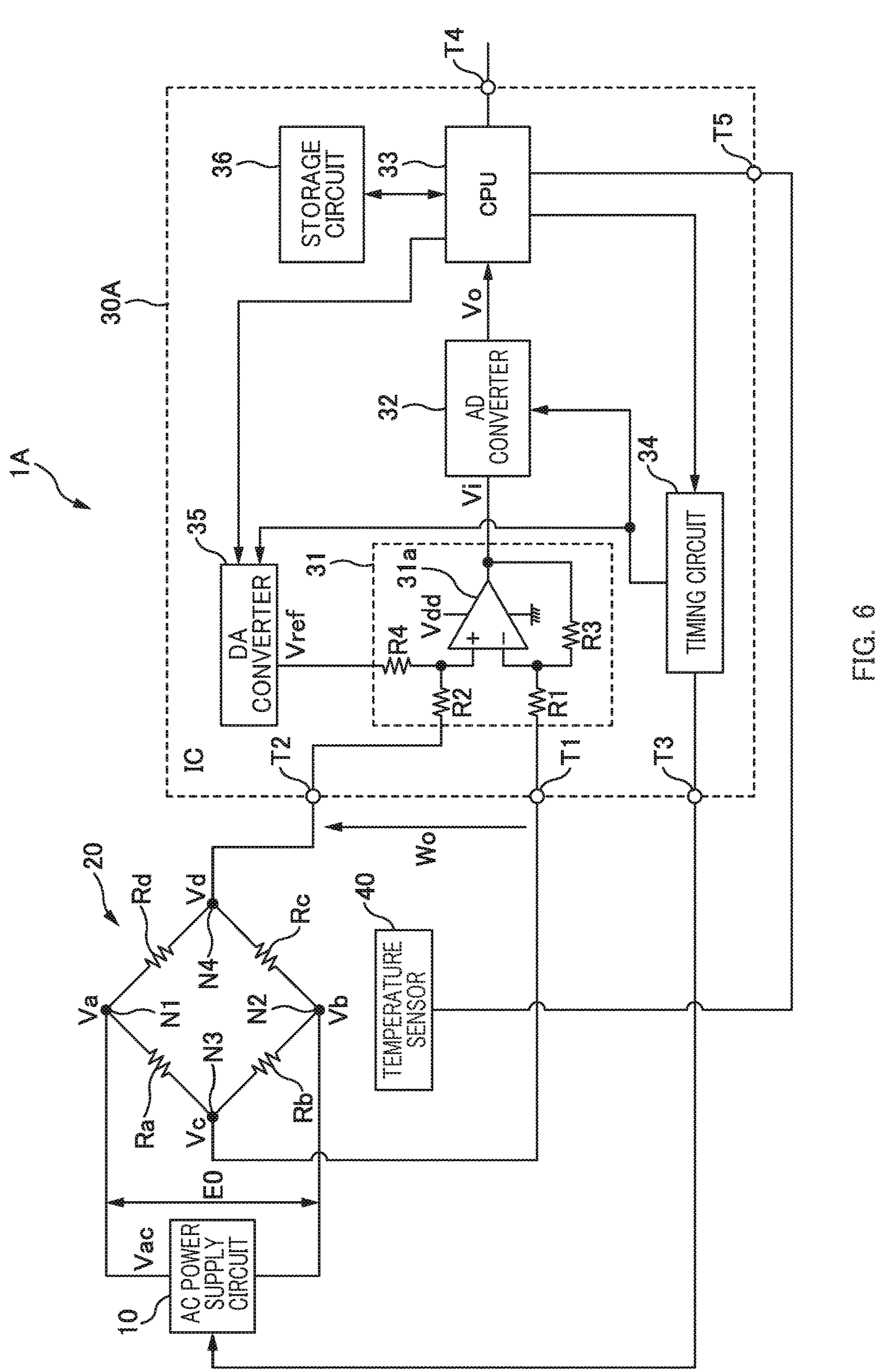
FIG. 6 is a diagram illustrating a configuration of a semiconductor device 1A according to a second embodiment.

FIG. 6 is a diagram illustrating a configuration of a semiconductor device 1A according to a second embodiment. In the second embodiment, even when an error (offset voltage ΔS) of the bridge circuit 20 varies with a temperature, the error can be corrected.

In the second embodiment, the semiconductor device 1A includes an IC 30A and a temperature sensor 40.

The temperature sensor 40 is a temperature detection element (e.g., a thermistor) to detect the temperature of the bridge circuit 20 and is arranged near the bridge circuit 20. The temperature sensor 40 is not limited to the thermistor, and an element other than the thermistor may be used.

The IC 30A includes a differential amplifier circuit 31, an AD converter 32, a CPU 33, a timing circuit 34, a DA converter 35, a storage circuit 36, and terminals T1 to T5.

The storage circuit 36 is a circuit to store various types of data and various programs, and includes, for example, a non-volatile memory (e.g., an EPROM, a flash memory, and/or the like). The storage circuit 36 according to an embodiment of the present disclosure also stores a look-up table (hereinafter simply referred to as "table") presenting information on a relationship between the temperature and the offset voltage ΔS of the bridge circuit 20. In the table, multiple temperatures and the offset voltages ΔS respectively corresponding to the temperatures are associated with each other.

The CPU 33 is coupled to the temperature sensor 40 through the terminal T5. The CPU 33 reads the offset voltage ΔS associated with a detection result (detected temperature) of the temperature sensor 40 from the table in the storage circuit 36, and uses the read offset voltage ΔS to calculate the reference voltage Vref. This can correct the temperature-dependency of the offset voltage ΔS of the bridge circuit 20.

Note that the multiple temperatures and two levels of the reference voltage Vref may be previously associated with each other in the table. In this case, the CPU 33 only has to read the reference voltage Vref associated with the detected temperature, and thus does not have to perform calculation of the reference voltage Vref (calculation using the offset voltage ΔS and the amplification factor Gw of the differential amplifier circuit 31).

In the second embodiment, the offset voltage ΔS of the bridge circuit 20 can be corrected even when the offset voltage ΔS varies with the temperature. Thus, the sensing accuracy can be more improved.

Summary

The IC 30 in an embodiment of the present disclosure has been described hereinabove. The IC 30 includes the differential amplifier circuit 31 and the DA converter 35. The differential amplifier circuit 31 outputs the voltage Vi based on the reference voltage Vref and the voltage obtained by amplifying, by the amplification factor Gw, the output voltage WO outputted from the pair of output terminals (nodes N3 and N4), according to the voltages Va and Vb (AC voltage) applied to the pair of input terminals (nodes N1 and N2) of the bridge circuit 20. The DA converter 35 sets the reference voltage Vref (Vref1) to 4.5 V (=2.5 V+200 mV×10) when Va<Vb or sets the reference voltage Vref (Vref2) to 0.5 V (=2.5 V-200 mV×10) when Va>Vb.

This makes it possible to remove the offset voltage ΔS of the bridge circuit 20, thereby being able to improve the sensing accuracy.

The DA converter 35 is used as a circuit to output the reference voltage Vref.

This makes it possible to set (change) the reference voltage Vref to a desired level.

Moreover, the IC 30 includes the AD converter configured to convert the voltage Vi (voltages V1 and V2) outputted from the differential amplifier circuit 31 into digital values, and the CPU 33 configured to calculate a physical quantity (such as pressure) measured by the bridge circuit 20, based on the digital values.

This makes it possible to accurately obtain the detection result of the bridge circuit 20.

The IC 30A according to the second embodiment includes the storage circuit 36 configured to store information on a relationship between the temperature and the offset voltage ΔS of the bridge circuit 20. Then, based on the above information and a detection result of the temperature sensor 40 configured to detect the temperature of the bridge circuit 20, the CPU 33 causes the DA converter 35 to output the reference voltage Vref corresponding to the detection result.

This makes it possible to deal with the temperature-dependency of the offset voltage ΔS of the bridge circuit 20, to thereby improve the sensing accuracy even when the temperature changes.

Moreover, the differential amplifier circuit 31 includes the operational amplifier 31*a* including the inverting input terminal (negative terminal) and the non-inverting input terminal (positive terminal), and the resistors R1 to R4.

The resistor R1 is coupled between the output terminal (node N3) of the bridge circuit 20 and the negative terminal of the operational amplifier 31*a*, and the resistor R2 is coupled between the output terminal (node N4) of the bridge circuit 20 and the positive terminal of the operational amplifier 31*a*. The resistor R3 is the feedback resistor coupled between the output and the negative terminal of the operational amplifier 31*a*. The resistor R4 has one end coupled to the positive terminal of the operational amplifier 31*a* and the other end configured to receive the reference voltage Vref.

This makes it possible to amplify a minute level of signal (output of the bridge circuit 20), based on the reference voltage Vref, by the amplification factor Gw according to the resistance values of the resistors R1 to R4.

Other Embodiments

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

In embodiments described above, the DA converter 35 switches the reference voltage Vref between the two levels (4.5 V and 1.5 V), in response to an instruction from the CPU 33, but the present disclosure is not limited to this. For example, a configuration may be such that two voltage sources and a switch are included, and either voltage of the two voltage sources may be applied to the differential amplifier circuit 31 (specifically, the resistor R4), with switching by the switch. In this case, the two voltage sources and the switch correspond to the "reference voltage output circuit".

The present invention is directed to provision of an integrated circuit and a semiconductor device capable of improving sensing accuracy.

According to the present invention, it is possible to improve sensing accuracy.

What is claimed is:

1. An integrated circuit coupled to a bridge circuit having a pair of input terminals and a pair of output terminals, the integrated circuit comprising:

an amplifier circuit configured to output a first voltage, in a first case in which the pair of input terminals of the bridge circuit have a first input voltage applied thereto, the first voltage being based on a reference voltage and a first amplified voltage that is obtained by amplifying, by a predetermined gain, a first output voltage outputted from the pair of output terminals of the bridge circuit, and output a second voltage, in a second case in which the pair of input terminals of the bridge circuit have a second input voltage of a polarity opposite to that of the first input voltage applied thereto, the second voltage being based on the reference voltage and a second amplified voltage that is obtained by amplifying, by the predetermined gain, a second output voltage outputted from the pair of output terminals of the bridge circuit; and a reference voltage output circuit configured to set a level of the reference voltage to a first level, in the first case, and set the level of the reference voltage to a second level, in the second case, wherein the first level is a level corresponding to a sum of a predetermined voltage and a third amplified voltage that is obtained by amplifying, by the predetermined gain, an offset voltage generated at the pair of output terminals of the bridge circuit, and the second level is a level corresponding to a difference between the predetermined voltage and the third amplified voltage.

2. The integrated circuit according to claim 1, wherein the reference voltage output circuit is a digital-to-analog converter.

3. The integrated circuit according to claim 2, further comprising:

an analog-to-digital converter configured to convert each of the first and second voltages into a digital value; and a processor circuit configured to calculate a physical quantity measured by the bridge circuit, based on the digital value.

4. The integrated circuit according to claim 3, further comprising: a storage circuit configured to store information on a relationship between the temperature of the bridge circuit and the offset voltage, wherein the processor circuit causes the digital-to-analog converter to output a value of the reference voltage corresponding to a detection result of a temperature detection element configured to detect the temperature of the bridge circuit, based on the detection result and the stored information.

5. The integrated circuit according to claim 1, wherein the amplifier circuit includes:

an operational amplifier having an inverting input terminal and a non-inverting input terminal;

a first resistor coupled between one of the pair of output terminals of the bridge circuit and the inverting input terminal;

a second resistor coupled between the other of the pair of output terminals of the bridge circuit and the non-inverting input terminal;

a third resistor coupled between an output of the operational amplifier and the inverting input terminal; and a fourth resistor having one end coupled to the non-inverting input terminal and the other end configured to receive the reference voltage.

6. A semiconductor device comprising:

a bridge circuit having a pair of input terminals and a pair of output terminals;

an amplifier circuit configured to output a first voltage, in a first case in which the pair of input terminals of the bridge circuit have a first input voltage applied thereto, the first voltage being based on a reference voltage and a first amplified voltage that is obtained by amplifying, by a predetermined gain, a first output voltage outputted from the pair of output terminals of the bridge circuit, and output a second voltage, in a second case in which the pair of input terminals of the bridge circuit have a second input voltage of a polarity opposite to that of the first input voltage applied thereto, the second voltage being based on the reference voltage and a second amplified voltage that is obtained by amplifying, by the predetermined gain, a second output voltage outputted from the pair of output terminals of the bridge circuit; and a reference voltage output circuit configured to set a level of the reference voltage to a first level, in the first case, and set the level of the reference voltage to a second level, in the second case, wherein the first level is a level corresponding to a sum of a predetermined voltage and a third amplified voltage that is obtained by amplifying, by the predetermined gain, an offset voltage generated at the pair of output terminals of the bridge circuit, and the second level is a level corresponding to a difference between the predetermined voltage and the third amplified voltage.

* * * * *